United States Patent
Guerrero, Jr.

(10) Patent No.: US 11,895,795 B2
(45) Date of Patent: Feb. 6, 2024

(54) EXTENDABLE COVER FOR A PORTABLE ELECTRONIC DEVICE

(71) Applicant: Razer (Asia-Pacific) Pte. Ltd., Singapore (SG)

(72) Inventor: Gil Palma Guerrero, Jr., Singapore (SG)

(73) Assignee: Razer (Asia-Pacific) Pte. Ltd., Singapore (SG)

( * ) Notice: Subject to any disclaimer, the term of this patent is extended or adjusted under 35 U.S.C. 154(b) by 393 days.

(21) Appl. No.: 17/385,820

(22) Filed: Jul. 26, 2021

(65) Prior Publication Data
US 2022/0039280 A1  Feb. 3, 2022

(30) Foreign Application Priority Data
Jul. 28, 2020 (AU) ................................ 2020101534

(51) Int. Cl.
| H05K 5/03 | (2006.01) |
| A63F 13/24 | (2014.01) |
| A45C 11/00 | (2006.01) |

(52) U.S. Cl.
CPC ............ *H05K 5/03* (2013.01); *A45C 11/00* (2013.01); *A63F 13/24* (2014.09); *A45C 2011/002* (2013.01)

(58) Field of Classification Search
CPC ............ H05K 5/03; A63F 13/24; A63F 13/98
See application file for complete search history.

(56) References Cited

U.S. PATENT DOCUMENTS

| 7,833,097 B1 | 11/2010 | Maddox et al. |
| 9,654,606 B1 * | 5/2017 | Warren ............... H04R 1/1033 |
| 9,914,060 B1 | 3/2018 | Corigliano |

(Continued)

FOREIGN PATENT DOCUMENTS

| CN | 204362114 U | 5/2015 |
| CN | 104941179 B | 3/2018 |

(Continued)

OTHER PUBLICATIONS

New 7007F Game Controller Wireless Bluetooth Gamepad Extendable Joypad Joystick for Android/IOS Phone Tablet Windows PC (https://www.allexpress.com/i/32966271189.html) in 4 pages; date visited May 27, 2020.

*Primary Examiner* — James S. McClellan
(74) *Attorney, Agent, or Firm* — Polsinelli P.C.

(57) ABSTRACT

An extendable cover for a portable electronic device including a first back panel having a first edge portion and a second back panel having a second edge portion. The first back panel and the second back panel being linearly slidable to move the first and second edge portions relative to each other along a sliding axis, wherein the first and second edge portions are opposite ends of the extendable cover along the sliding axis. The cover may include an electrical cable management arrangement having a rotatable hub disposed at the second back panel, and a hub-biasing mechanism coupled between the rotatable hub and the second back panel to bias the rotatable hub in a biased rotational direction to reel in a first electrical cable extending between the first back panel and the rotatable hub as the first and the second edge portions are moved towards each other.

20 Claims, 6 Drawing Sheets

(56) References Cited

U.S. PATENT DOCUMENTS

| | | | |
|---|---|---|---|
| D819,696 S | 6/2018 | Ehara et al. | |
| 10,525,360 B1 | 1/2020 | Corigliano | |
| 2009/0147485 A1* | 6/2009 | Higashigawa | H04M 1/0237 |
| | | | 312/334.1 |
| 2013/0184077 A1 | 7/2013 | Galpern | |
| 2014/0179437 A1 | 6/2014 | King et al. | |
| 2015/0273325 A1* | 10/2015 | Falc | A63F 13/24 |
| | | | 463/37 |
| 2015/0364875 A1* | 12/2015 | Ginsberg | H02J 7/0042 |
| | | | 320/137 |
| 2016/0043514 A1* | 2/2016 | George | H01R 35/025 |
| | | | 439/501 |
| 2016/0241290 A1* | 8/2016 | Alshammari | H04B 1/3883 |
| 2017/0237843 A1* | 8/2017 | Ackeret | B60R 11/0252 |
| | | | 455/575.9 |
| 2020/0139232 A1 | 5/2020 | Koizumi et al. | |

FOREIGN PATENT DOCUMENTS

| | | |
|---|---|---|
| CN | 209952214 U | 1/2020 |
| KR | 10-1204815 B1 | 11/2012 |
| KR | 2015-0053241 A | 5/2015 |

\* cited by examiner

EXTENDABLE COVER FOR A PORTABLE ELECTRONIC DEVICE

CROSS REFERENCE TO RELATED APPLICATIONS

The present application claims the benefit of Australia innovation patent no. 2020101534 filed on 28 Jul. 2020, the entire contents of which are incorporated herein by reference for all purposes.

TECHNICAL FIELD

Various embodiments generally relate to an extendable cover for a portable electronic device.

BACKGROUND

In recent years, gaming using portable electronic devices, such as smartphones, mobile phones, tablets, etc., has gained popularity. Typically, controls for the games are usually based on virtual buttons on the touch screen of the portable electronic devices. However, the virtual buttons controls are not ideal for the user's gaming experience because these virtual buttons are typically overlaid on the game and placing the thumb over the virtual buttons would cover portions of the screen. Thus, some details of the games may be covered. To enhance the experience of gaming using portable electronic devices, mobile controllers which are attachable to the portable electronic devices have been developed such that the control buttons are located on the mobile controllers and the screen of the portable electronic devices can be fully utilised to display the game. However, usually a user of the portable electronic device would have placed the portable electronic device in a cover in order to protect the portable electronic device from liquid spills, scratches, heat, dust etc. Thus, in order to use the mobile controllers, the user has to remove the cover and attach the mobile controllers to the portable electronic device. This may be cumbersome as the user has to swap between placing the portable electronic device in the cover and attaching the mobile controllers to the portable electronic device. Alternatively, a cover with integrated mobile controllers have also been developed. However, such cover with integrated mobile controllers is typically bulky. Thus, rendering the sleek configuration of most portable electronic device ineffective.

Accordingly, there is a need for a more versatile and elegant solution to maintain the sleekness of the portable electronic device while also facilitating gaming.

SUMMARY

According to various embodiments, there is provided an extendable cover for a portable electronic device. The cover may include a first back panel having a first edge portion. The cover may include a second back panel having a second edge portion. The first back panel and the second back panel may be in sliding engagement with each other so as to be linearly slidable relative to each other to move the first edge portion and the second edge portion towards each other or away from each other along a sliding axis. The first edge portion of the first back panel and the second edge portion of the second back panel may be opposite ends of the extendable cover along the sliding axis. The cover may include an electrical cable management arrangement. The electrical cable management arrangement may include a rotatable hub disposed at the second back panel, and a hub-biasing mechanism coupled between the rotatable hub and the second back panel to bias the rotatable hub in a biased rotational direction to reel in a first electrical cable extending between the first back panel and the rotatable hub as the first back panel and the second back panel are being slidden relative to each other to move the first edge portion of the first back panel and the second edge portion of the second back panel towards each other. A first segment of the first electrical cable may be coupled to the first back panel and a second segment of the first electrical cable may be coupled to the rotatable hub.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1A:
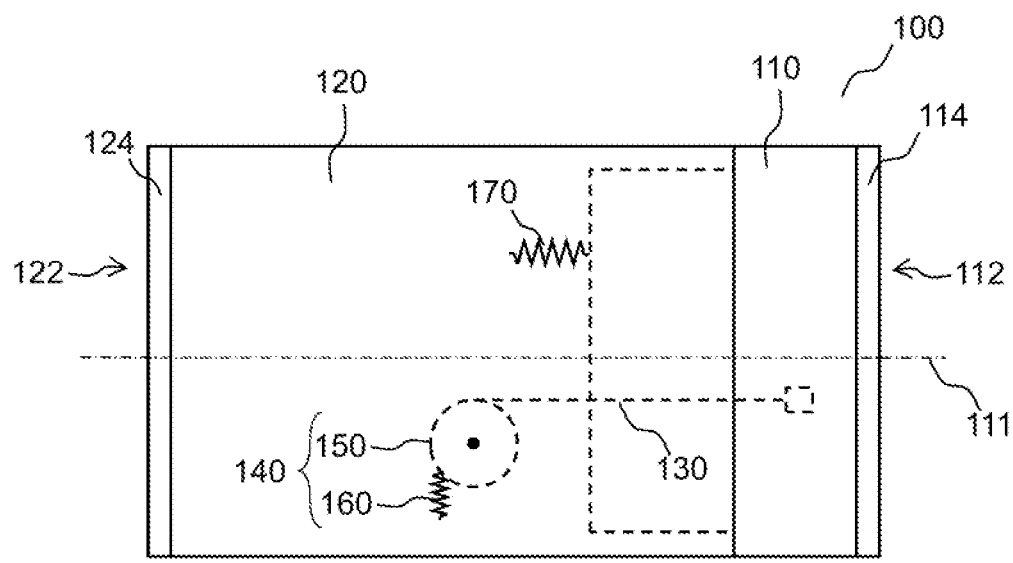
FIG. 1A shows a schematic top view of an extendable cover for a portable electronic device in a retracted state according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to an extendable cover (or an extendable case) for a portable electronic device. According to various embodiments, the portable electronic device may include a smartphone, a mobile phones, a tablet, or any suitable handheld, lightweight electronic devices. According to various embodiments, the extendable cover may include an extendable casing, extendable shell, extendable backing, or extendable frame for placing over a back surface of the portable electronic device such that a screen of the portable electronic device may be exposed. According to various embodiments, the extendable cover may be configured to be retractably extended or stretched so as to fit different orientation of the portable electronic device or different sizes of portable electronic device. According to various embodiments, the extendable cover may include at least two parts in engagement with each other so as to be retractably extendable relative to each other. According to various embodiments, the at least two parts of the extendable cover may be biased towards the retracted state for holding or retaining or gripping or clamping the portable electronic device to the extendable cover. Accordingly, the at least two parts of the extendable cover may be biased to move towards each other so as to urge or pull the at least two parts of the extendable cover towards each other for holding or retaining or gripping or clamping the portable electronic device.

According to various embodiments, electrical lines or wiring or cabling may run between the at least two parts of the extendable cover. According to various embodiments, the extendable cover may include an electrical cable management arrangement configured to manage and prevent the electrical lines or wiring or cabling from tangling or kinking or crisscrossing or straining or twisting when the at least two parts of the extendable cover extend and/or retract with respect to each other. According to various embodiments, the electrical cable management arrangement may be configured to retract or reel in or wind or shorten the electrical lines or wiring or cabling when the at least two parts of the extendable cover are retracted with respect to each other. Further, the electrical cable management arrangement may be configured to extend or reel out or unwind or lengthen or payout the electrical lines or wiring or cabling when the at least two parts of the extendable cover are extended with respect to each other.

According to various embodiments, the electrical lines or wiring or cabling between the at least two parts of the extendable cover may electrically couple the at least two parts of the extendable cover so as to allow electrical communication between the at least two parts of the extendable cover. For example, when each of the at least two parts of the extendable cover is configured to be coupled to a mobile controller such that a pair of mobile controllers may be coupled to the extendable cover, the mobile controller at each of the at least two parts of the extendable cover may electrically communicate with the other via the electrical lines or wiring or cabling between the at least two parts of the extendable cover. In this configuration, each of the at least two parts of the extendable cover may be configured to couple with a corresponding mobile controller. As another example, when each of the at least two parts of the extendable cover includes at least one control button, the at least one control button at each of the at least two parts of the extendable cover may electrically communicate with the other via the electrical lines or wiring or cabling between the at least two parts of the extendable cover.

According to various embodiments, the extendable cover may include a stand removably attached to the extendable cover. According to various embodiments, the stand may be configured to hold the portable electronic device such that the portable electronic device may be standing with respect to a surface when the stand is removed from the extendable cover and placed on the surface. According to various embodiments, the stand may be folded and attached to the extendable cover when not in use.

According to various embodiments, there is provided an extendable cover or an extendable case that can hold portable electronic devices of different sizes and connect to gaming controllers on its left and right ends. According to various embodiments, the extendable cover may have a cable management arrangement (or a cable routing mechanism) and a stand (or a phone stand). According to various embodiments, the cable management arrangement (or the cable routing mechanism may makes the cable (e.g. flex cable) inside the extendable cover dressed properly in order to withstand the usual product life cycle of the cover. While the cable carries electrical connections and may be flexible, there are still some limitations. For example, the cable may get tangled and squash if it is not properly dressed even so for the extendable cover which moves. According to various embodiments, the extendable cover may be integrated with a stand made in such a way that it is portable and may be carried together with or without the controllers when not in use for better product mobility.

Figure 1B:
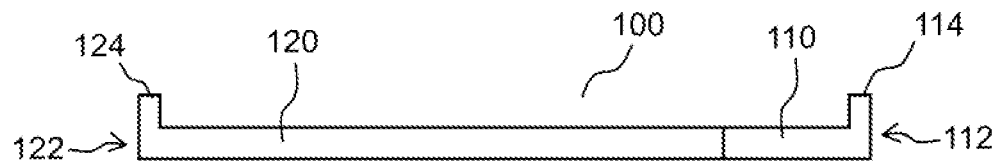
FIG. 1B shows a schematic front view of the extendable cover of FIG. 1A according to various embodiments.
Figure 1C:
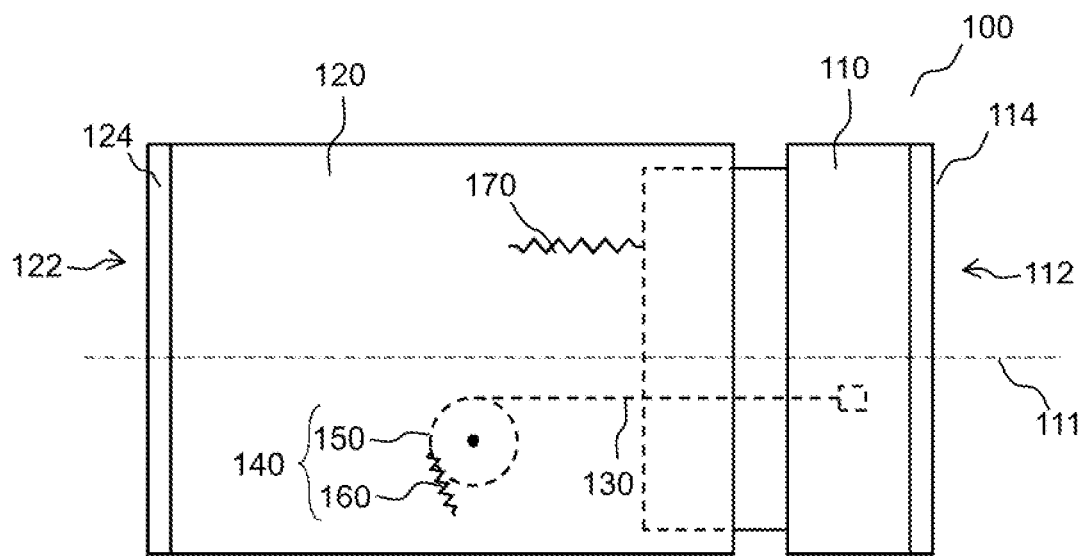
FIG. 1C shows a schematic top view of the extendable cover of FIG. 1A in an extended state according to various embodiments.

FIG. 1A shows a schematic top view of an extendable cover 100 for a portable electronic device in a retracted state according to various embodiments. FIG. 1B shows a schematic front view of the extendable cover 100 of FIG. 1A according to various embodiments. FIG. 1C shows a schematic top view of the extendable cover 100 in an extended state according to various embodiments. According to various embodiments, the extendable cover 100 may include a first back panel 110 and a second back panel 120. According to various embodiments, the first back panel 110 and the second back panel 120 may together form a continuous back portion of the extendable cover 100 on which a back surface of the portable electronic device may be placed or received or to which the back surface of the portable electronic device may be in contact or immediately adjacent or loosely abutting when the portable electronic device is fitted in the extendable cover 100. According to various embodiments, the back surface of the portable electronic device may be a surface of the portable electronic device that is opposite a screen/display of the portable electronic device.

According to various embodiments, the first back panel 110 may have a first edge portion 112. According to various embodiments, the first edge portion 112 may be a portion of the first back panel 110 towards or alongside an end or border or boundary or edge or margin of the first back panel 110. According to various embodiments, the second back panel 120 may have a second edge portion 122. According to various embodiments, the second edge portion 122 may be a portion of the second back panel 120 towards or alongside an end or border or boundary or edge or margin of the second back panel 120.

According to various embodiments, the first back panel 110 and the second back panel 120 may be in sliding engagement with each other. Accordingly, the first back panel 110 and the second back panel 120 may be coupled to or attached to or engaged with each other so as to be capable of moving relative to each other in a sliding manner. According to various embodiments, the first back panel 110 and the second back panel 120 may be linearly slidable relative to each other to move the first edge portion 112 and the second edge portion 122 towards each other or away from each other along a sliding axis 111. Accordingly, the first back panel 110 and the second back panel 120 may be oriented such that the first edge portion 112 and the second edge portion 122 may lie on the sliding axis 111. Further, relative sliding movement between the first back panel 110 and the second back panel 120 along the sliding axis 111 may bring the first edge portion 112 and the second edge portion 122 closer to each other or further apart from each other. According to various embodiments, the first edge portion 112 of the first back panel 110 and the second edge portion 122 of the second back panel 120 may be opposite ends or sides or boundary or border of the extendable cover 100 along the sliding axis 111. Accordingly, the first back panel 110 and the second back panel 120 may be oriented with the first edge portion 112 and the second edge portion 122 directed away from each other. Hence, the first edge portion 112 may be opposite the second edge portion 122 across the extendable cover 100 along the sliding axis 111. According to various embodiments, the first edge portion 112 of the first back panel 110 and the second edge portion 122 of the second back panel 120 may be parallel to each other. Accordingly, each of first back panel 110 and the second back panel 120 may be oriented with the first edge portion 112 and the second edge portion 122 respectively lying transversely across the sliding axis 111.

According to various embodiments, the extendable cover 100 may include electrical lines or wiring or cabling. According to various embodiments, the electrical lines or wiring or cabling may be inside or within the extendable cover 100. According to various embodiments, as shown, the extendable cover 100 may include an electrical cable 130 extending between the first back panel 110 and the second back panel 120. Accordingly, the electrical cable 130 may run from the first back panel 110 to the second back panel 120. The electrical cable 130 may be part of the electrical lines or wiring or cabling of the extendable cover 100. According to various embodiments, the electrical cable 130 may allow or enable electrical communication or signal transmission between the first back panel 110 and the second back panel 120. According to various embodiments, the electrical cable 130 may include, but not limited to, flexible flat cable, flexible cable, ribbon cable, coaxial cable, or wire.

According to various embodiments, the extendable cover 100 may include an electrical cable management arrangement 140. According to various embodiments, the electrical cable management arrangement 140 may be configured to manage and prevent the electrical cable 130 from tangling or kinking or crisscrossing or straining or twisting when the first back panel 110 and the second back panel 120 the extendable cover 100 extend and/or retract with respect to each other. According to various embodiments, the electrical cable management arrangement 140 may be configured to retract or reel in or wind or shorten the electrical cable 130 when the first back panel 110 and the second back panel 120 are retracted with respect to each other. Further, the electrical cable management arrangement 140 may be configured to extend or reel out or unwind or lengthen or payout the electrical cable 130 when the first back panel 110 and the second back panel 120 are extended with respect to each other.

According to various embodiments, the electrical cable management arrangement 140 may include a rotatable hub 150 disposed at the second back panel 120. Accordingly, the rotatable hub 150 may be rotatably mounted to the second back panel 120. Hence, the rotatable hub 150 may be rotatable relative to the second back panel 120. According to various embodiments, the rotatable hub 150 may be disposed inside or within the second back panel 120. According to various embodiments, a rotational axis of the rotatable hub 150 may be perpendicular to the second back panel 120.

According to various embodiments, the electrical cable management arrangement 140 may include a hub-biasing mechanism 160. According to various embodiments, the hub-biasing mechanism 160 may be coupled between the rotatable hub 150 and the second back panel 120. Accordingly, the hub-biasing mechanism 160 may interconnect the rotatable hub 150 and the second back panel 120. According to various embodiments, the hub-biasing mechanism 160 may bias the rotatable hub 150 in a biased rotational direction relative to the second back panel 120. Accordingly, the hub-biasing mechanism 160 may exert a biasing force against rotating the rotatable hub 150 in a rotational direction that is opposite the biased rotational direction. According to various embodiments, when the rotatable hub 150 is rotated in the rotational direction that is opposite the biased rotational direction, the hub-biasing mechanism 160 may be loaded or imparted with the biasing force to reverse the rotation so as to rotate the rotatable hub 150 in the biased rotational direction to return to a state or disposition before the rotatable hub 150 is rotated and/or the hub-biasing mechanism 160 is loaded.

According to various embodiments, the electrical cable 130 may be extending between the first back panel 110 and the rotatable hub 150 at the second back panel 120. Accordingly, the electrical cable 130 may run from the first back panel to the rotatable hub 140. According to various embodiments, a first segment of the electrical cable 130 may be coupled to the first back panel 110 and a second segment of the electrical cable 130 is coupled to the rotatable hub 150. According to various embodiments, the first segment of the electrical cable 130 may be a first end segment of the electrical cable 130 and the second segment of the electrical cable 130 may be a second end segment of the electrical cable 130.

According to various embodiments, the hub-biasing mechanism 160 may bias the rotatable hub 150 in the biased rotational direction to reel in or retract or wind or shorten the electrical cable 130, which is extending between the first back panel 110 and the rotatable hub 150 at the second back panel 120, as the first back panel 110 and the second back panel 120 are being slidden relative to each other to move the first edge portion 112 of the first back panel 110 and the second edge portion 122 of the second back panel 120 towards each other. According to various embodiments, the hub-biasing mechanism 160 may be unloaded or may be pre-loaded with slight biasing force when the first back panel 110 and the second back panel 120 of the extendable cover 100 are in the retracted state as shown in FIG. 1A. According to various embodiments, as the first back panel 110 and the second back panel 120 are being pulled away from each other (or slidden relative to each other) so as to move the first edge portion 112 and the second edge portion 122 further apart or away from each other along the sliding axis 111 to the extended state as shown in FIG. 1C, the electrical cable 130 may extend or reel out or unwind or lengthen or payout from the rotatable hub 150 as a result of the extension between the first back panel 110 and the second back panel 120 along the sliding axis 111. As the electrical cable 130 is being extended or reeled out or unwound or lengthened or payout from the rotatable hub 150, the rotatable hub 150 may be rotated in the rotational direction that is opposite the biased rotational direction. Accordingly, rotating the rotatable hub 150 in the rotational direction that is opposite the biased rotational direction may load the hub-biasing mechanism 160. The biasing force exerted on the rotatable hub 150 by the hub-biasing mechanism 160 may then rotate the rotatable hub 150 in the biased rotational direction to reel in or retract or wind or shorten the electrical cable 130 when the first back panel 110 and the second back panel 120 are being slidden relative to each other to move the first edge portion 112 of the first back panel 110 and the second edge portion 122 of the second back panel 120 towards each other.

According to various embodiments, the hub-biasing mechanism 160 may include, but not limited to, a coil spring, a tension spring, a compression spring, a torsion spring, a spiral torsion spring, or a leaf spring. According to various embodiments, when the hub-biasing mechanism 160 is a spring, a first end of the spring may be coupled to the rotatable hub 150 and a second end of the spring may be coupled to the second back panel 120.

According to various embodiments, the first edge portion 112 of the first back panel 110 may include a first raised edge formation 114. According to various embodiments, the first raised edge formation 114 may include, but not limited to, a lip or a ledge or a long narrow elevation or a ridge along the first edge portion 112. Accordingly, the first raised edge formation 114 may be a narrow protruding edge along the first edge portion 112. According to various embodiments, the second edge portion 122 of the second back panel 120 may include a second raised edge formation 124. According to various embodiments, the second raised edge formation 124 may include, but not limited to, a lip or a ledge or a long narrow elevation or a ridge along the second edge portion 122. Accordingly, the second raised edge formation 124 may be a narrow protruding edge along the second edge portion 122.

According to various embodiments, the first back panel 110 and the second back panel 120 may be linearly slidable relative to each other to move the first raised edge formation 114 of the first back panel 110 and the second raised edge formation 124 of the second back panel 120 towards each other or away from each other along the sliding axis 111 for fitting the portable electronic device between the first raised edge formation 114 of the first back panel 110 and the second raised edge formation 124 of the second back panel 120. Accordingly, when the portable electronic device is fitted between the first raised edge formation 114 of the first back panel 110 and the second raised edge formation 124 of the second back panel 120, the first raised edge formation 114 and the second raised edge formation 124 may be moved towards each other to hold or retain or grip or clamp or sandwich the portable electronic device therebetween. According to various embodiments, the first raised edge formation 114 and the second raised edge formation 124 may be opposing each other across the extendable cover 100 along the sliding axis 111. According to various embodiments, the first raised edge formation 114 and the second raised edge formation 124 may be protruding from the first back panel 110 and the second back panel 120 respectively on a same side of the extendable cover 100. According to various embodiments, the first raised edge formation 114 and the second raised edge formation 124 may be a pair of parallel opposing narrow protruding edges along two opposite edge portions 112, 122 of the extendable cover 100.

According to various embodiments, the extendable cover 100 may include a panel-biasing mechanism 170. According to various embodiments, the panel-biasing mechanism 170 may be coupled between the first back panel 110 and the second back panel 120. Accordingly, the panel-biasing mechanism 170 may interconnect the first back panel 110 and the second back panel 120. According to various embodiments, the panel-biasing mechanism 170 may exert a biasing force against moving the first edge portion 112 of the first back panel 110 and the second edge portion 122 of the second back panel 120 away from each other along the sliding axis 111. Accordingly, the panel-biasing mechanism 170 may bias against moving the first raised edge formation 114 of the first back panel 110 and the second raised edge formation 124 of the second back panel 120 away from each other along the sliding axis 111. According to various embodiments, the panel-biasing mechanism 170 may be preloaded so as to hold or retain or maintain the first back panel 110 and the second back panel 120 of the extendable cover 100 in the retracted state as shown in FIG. 1A.

According to various embodiments, as the first back panel 110 and the second back panel 120 are being pulled away from each other (or slidden relative to each other) so as to move the first edge portion 112 and the second edge portion 122 (as well as the first raised edge formation 114 and the second raised edge formation 124) further apart or away from each other along the sliding axis 111 to the extended state as shown in FIG. 1C, extension between the first back panel 110 and the second back panel 120 may further load the panel-biasing mechanism 170. Accordingly, when the portable electronic device is fitted to the extendable cover 100 in the extended state, the biasing force exerted by the panel-biasing mechanism 170 may cause the first raised edge formation 114 and the second raised edge formation 124 to urge or move towards each other to hold or retain or grip or clamp or sandwich the portable electronic device therebetween. Hence, the panel-biasing mechanism 170 coupled between the first back panel 110 and the second back panel 120 may exert the biasing force to hold or retain or grip or clamp or sandwich the portable electronic device between the first raised edge formation 114 of the first back panel 110 and the second raised edge formation 124 of the second back panel 120. Further, when the portable electronic device is removed from the extendable cover 100, the biasing force exerted by the panel-biasing mechanism 170 may move the first back panel 110 and the second back panel 120 towards each other to return to the retracted state. Accordingly, the panel-biasing mechanism 170 may automatically return the extendable cover 100 to the retracted state without requiring external assistance or application of an external force.

According to various embodiments, the panel-biasing mechanism 170 may include, but not limited to, a coil spring, a tension spring, a compression spring, or a leaf spring. According to various embodiments, when the panel-biasing mechanism 170 is a spring, a first end of the spring may be coupled to the first back panel 110 and a second end of the spring may be coupled to the second back panel 120.

Figure 2A:
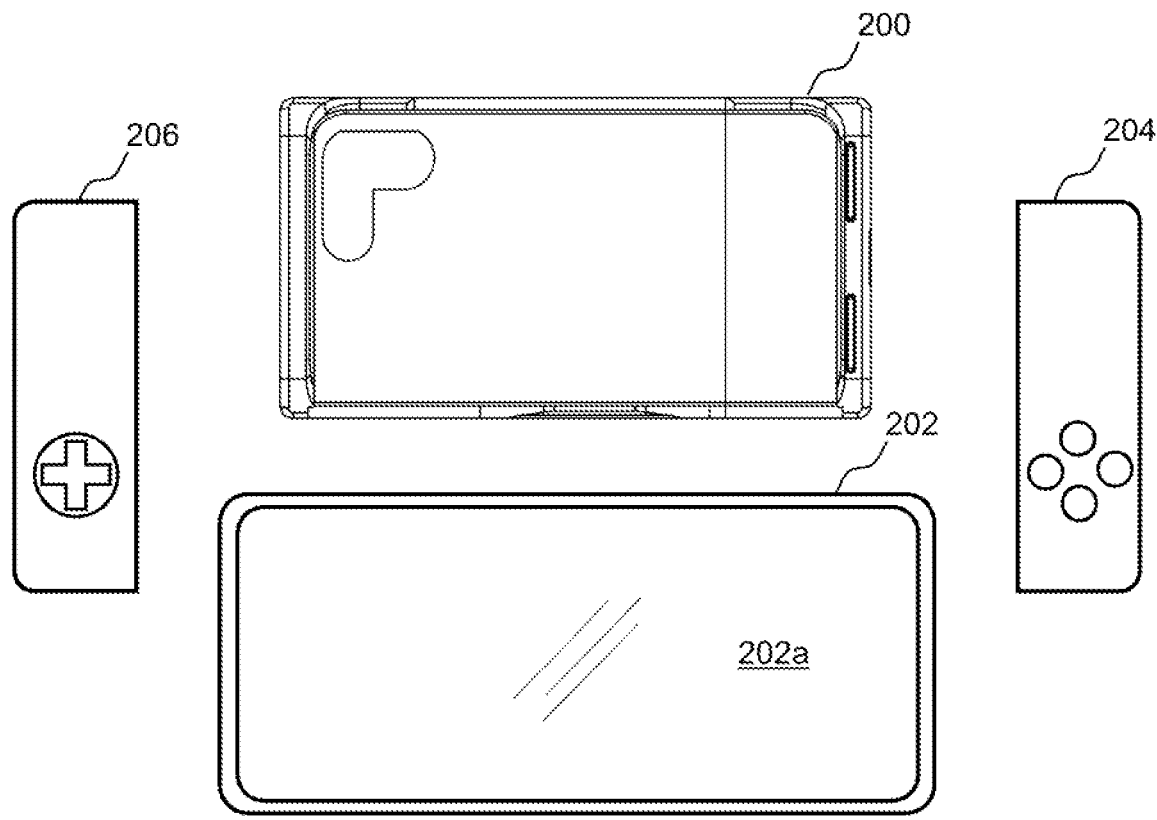
FIG. 2A shows an extendable cover, a portable electronic device, a first mobile controller and a second mobile controller in an unassembled state according to various embodiments.
Figure 2B:
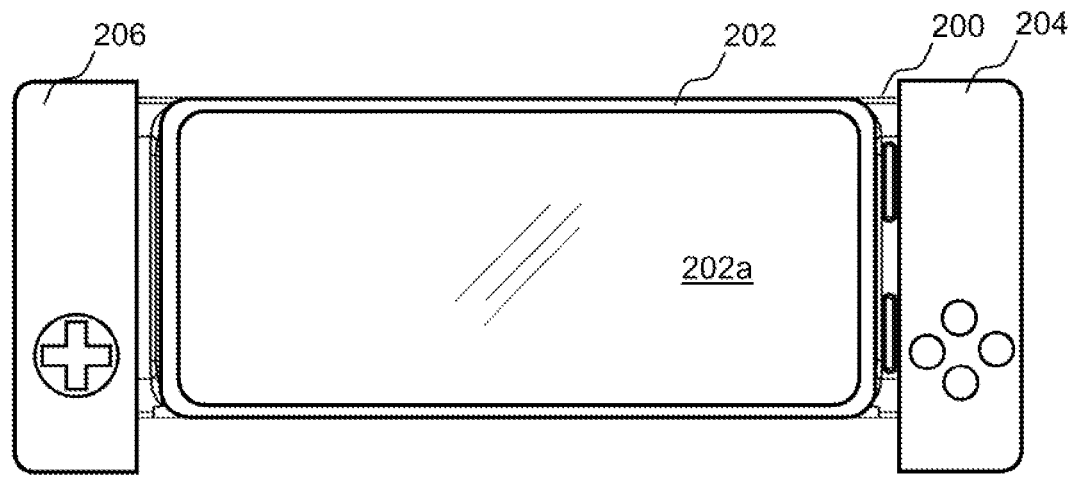
FIG. 2B shows the extendable cover, the portable electronic device, the first mobile controller and the second mobile controller of FIG. 2A in the assembled state wherein the portable electronic device is fitted to the extendable cover and the first and second mobile controllers are coupled to the extendable cover according to various embodiments.

FIG. 2A shows an extendable cover 200, a portable electronic device 202, a first mobile controller 204 and a second mobile controller 206 in an unassembled state according to various embodiments. FIG. 2B shows the extendable cover 200, the portable electronic device 202, the first mobile controller 204 and the second mobile controller 206 in the assembled state wherein the portable electronic device 202 is fitted to the extendable cover 200 and the first and second mobile controllers 204, 206 are coupled to the extendable cover 200 according to various embodiments.

According to various embodiments, the portable electronic device 202 may include a smartphone, a mobile phones, a tablet, or any suitable handheld, lightweight electronic devices. According to various embodiments, the extendable cover 200 may be an extendable casing, extendable shell, extendable backing, or extendable frame for placing over a back surface of the portable electronic device 202 such that a screen 202a of the portable electronic device 202 may be exposed. According to various embodiments, the extendable cover 200 may be configured to be retractably extended or stretched so as be fitted to the portable electronic device 202. According to various embodiments, the extendable cover 200 may include at least two parts in engagement with each other so as to be retractably extendable relative to each other. According to various embodiments, the extendable cover 200 may, similar to the extendable cover 100 of FIG. 1A, include a first back panel 210 and a second back panel 220. According to various embodiments, the first back panel 210 and the second back panel 220 of the extendable cover 200 may be biased towards the retracted state for holding or retaining or gripping or clamping the portable electronic device 202 to the extendable cover 200. Accordingly, the first back panel 210 and the second back panel 220 may be biased to move towards each other so as to urge or pull the first back panel 210 and the second back panel 220 of the extendable cover 200 towards each other for holding or retaining or gripping or clamping the portable electronic device 202.

According to various embodiments, each of the first back panel 210 and the second back panel 220 of the extendable cover 200 may be configured to be coupled to or to receive a corresponding mobile controller 204, 206 such that the pair of mobile controllers 204, 206 may be coupled to the extendable cover 200. According to various embodiments, the pair of mobile controllers 204, 206 may include a first controller 204 (or right controller) and a second controller 206 (or a left controller). According to various embodiments, the pair of mobile controllers 204, 206 may be coupled to opposite ends of the extendable cover 200.

According to various embodiments, the extendable cover 200 may include electrical lines or wiring or cabling extending between the first back panel 210 and the second back panel 220. According to various embodiments, the electrical lines or wiring or cabling between the first back panel 210 and the second back panel 220 may electrically couple the first back panel 210 and the second back panel 220 so as to allow electrical communication between the first back panel 210 and the second back panel 220. According to various embodiments, the pair of mobile controllers 204, 206 coupled to the first back panel 210 and the second back panel 220 respectively may electrically communicate with the each other via the electrical lines or wiring or cabling extending between the first back panel 210 and the second back panel 220 of the extendable cover 200.

According to various embodiments, the portable electronic device 202 may be fitted to the extendable cover 200 and the pair of mobile controllers 204, 206 may be fitted to the extendable cover 200 without requiring the portable electronic device 202 to be removed from the extendable cover 200. Accordingly, the extendable cover 200 may not be bulky when attached to the portable electronic device 202. Further, the pair of mobile controllers 204, 206, may be easily attached to the portable electronic device 202 for gaming purpose as and when required.

Figure 2C:
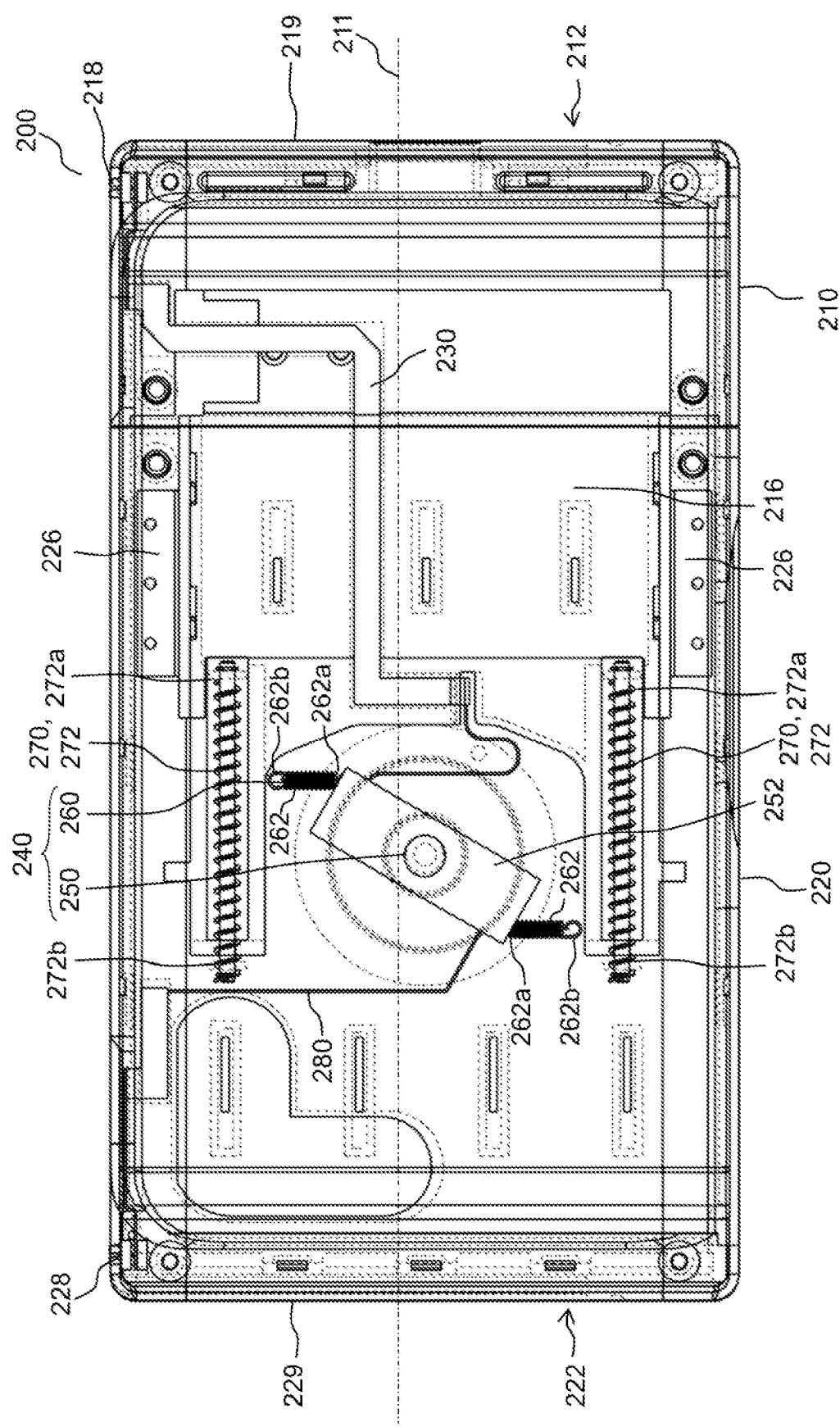
FIG. 2C shows a see-through top view of the extendable cover of FIG. 2A according to various embodiments.
Figure 2D:
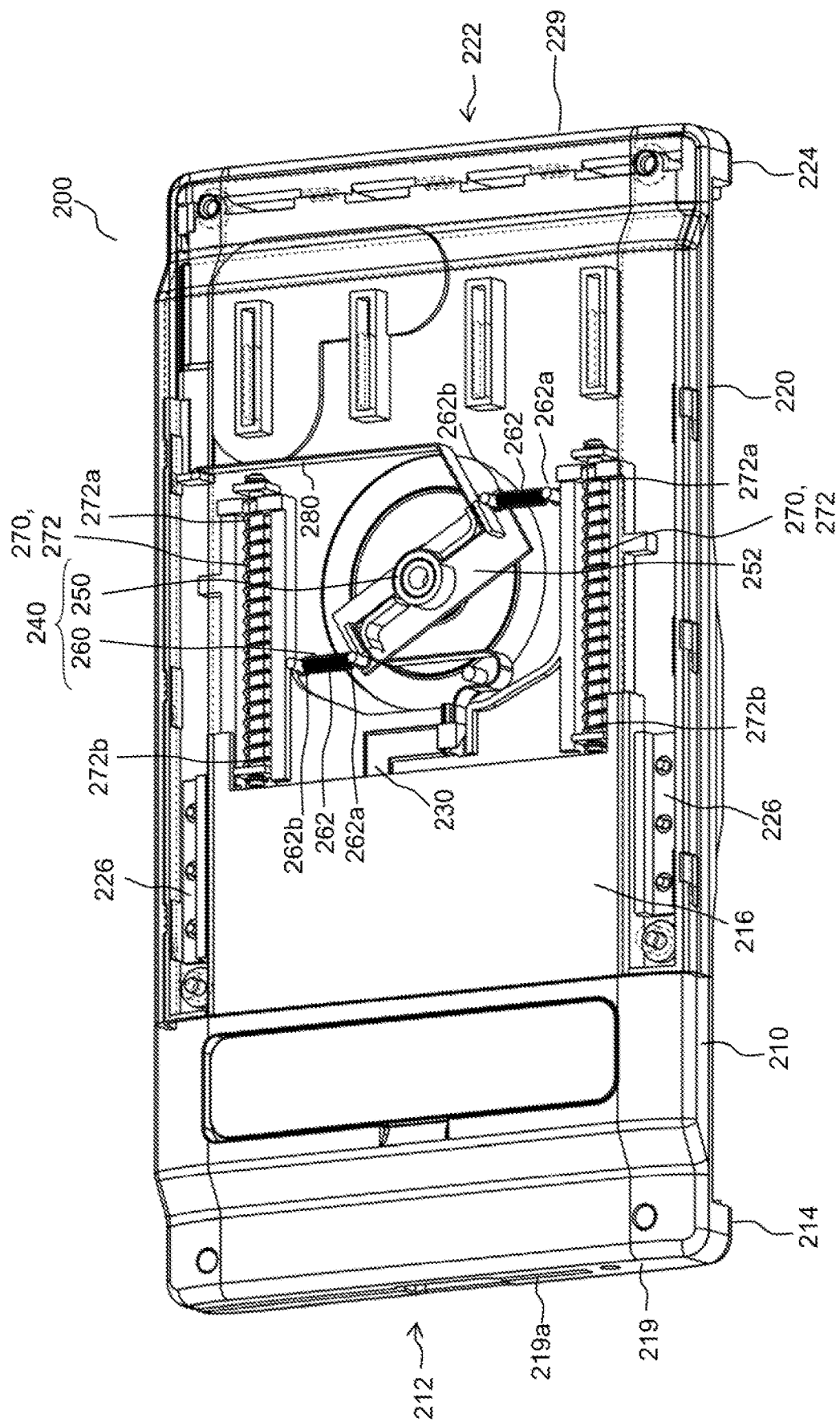
FIG. 2D shows a partial see-through back view of the extendable cover of FIG. 2A according to various embodiments.

FIG. 2C shows a see-through top view of the extendable cover 200 of FIG. 2A according to various embodiments. FIG. 2D shows a partial see-through back view of the extendable cover 200 of FIG. 2A according to various embodiments.

According to various embodiments, the extendable cover 200 may, similar to the extendable cover 100 of FIG. 1A to FIG. 1C, include the first back panel 210 and the second back panel 220. According to various embodiments, the first back panel 210 and the second back panel 220 may together form a continuous back portion of the extendable cover 200 on which a back surface of the portable electronic device 202 may be placed or received or to which the back surface of the portable electronic device 202 may be in contact or immediately adjacent or loosely abutting when the portable electronic device 202 is fitted in the extendable cover 200. According to various embodiments, the back surface of the portable electronic device 202 may be a surface of the portable electronic device 202 that is opposite a screen/display 202a of the portable electronic device 202.

According to various embodiments, the first back panel 210 may have a first edge portion 212. According to various embodiments, the first edge portion 212 may be a portion of the first back panel 210 towards or alongside an end or border or boundary or edge or margin of the first back panel 210. According to various embodiments, the second back panel 220 may have a second edge portion 222. According to various embodiments, the second edge portion 222 may be a portion of the second back panel 220 towards or alongside an end or border or boundary or edge or margin of the second back panel 220.

According to various embodiments, the first back panel 210 and the second back panel 220 may be in sliding engagement with each other. Accordingly, the first back panel 210 and the second back panel 220 may be coupled to or attached to or engaged with each other so as to be capable of moving relative to each other in a sliding manner. According to various embodiments, the first back panel 210 and the second back panel 220 may be linearly slidable relative to each other to move the first edge portion 212 and the second edge portion 222 towards each other or away from each other along a sliding axis 211. Accordingly, the first back panel 210 and the second back panel 220 may be oriented such that the first edge portion 212 and the second edge portion 222 may lie on the sliding axis 211. Further, relative sliding movement between the first back panel 210 and the second back panel 220 along the sliding axis 211 may bring the first edge portion 212 and the second edge portion 222 closer to each other or further apart from each other. According to various embodiments, the first edge portion 212 of the first back panel 210 and the second edge portion 222 of the second back panel 220 may be opposite ends or sides or boundary or border of the extendable cover 200 along the sliding axis 211. Accordingly, the first back panel 210 and the second back panel 220 may be oriented with the first edge portion 212 and the second edge portion 222 directed away from each other. Hence, the first edge portion 212 may be opposite the second edge portion 222 across the extendable cover 200 along the sliding axis 211. According to various embodiments, the first edge portion 212 of the first back panel 210 and the second edge portion 222 of the second back panel 220 may be parallel to each other. Accordingly, each of first back panel 210 and the second back panel 220 may be oriented with the first edge portion 212 and the second edge portion 222 respectively lying transversely across the sliding axis 211.

According to various embodiments, the second back panel 220 may be a hollow panel. According to various embodiments, the first panel 210 may be inserted into the second back panel 220 so as to be in sliding engagement with the second back panel 220. According to various embodiments, the second back panel 220 may include an opening along an edge of the second back panel 220 opposite the second edge portion 222 of the second back panel 220. According to various embodiments, the first panel 210 may include an insert portion 216 opposite the first edge portion 210 of the first back panel 210. According to various embodiments, the insert portion 216 of the first back panel 210 may be inserted into the second back panel 220 via the opening of the second back panel 220.

According to various embodiments, the second back panel 220 may include at least one guide member 226 inside the second back panel 220. According to various embodiments, the at least one guide member 226 may be in engagement with the insert portion 216 of the first back panel 210 for guiding the sliding motion between the first back panel 210 and the second back panel 220. According to various embodiments, the at least one guide member 226 may include, but not limited to, a guide rail, a guide track, a guide rod, or a guide slot. According to various embodiments, the second back panel 220 may include a pair of guide members 226. According to various embodiments, the pair of guide members 226 may be disposed inside the second back panel 220 and laterally spaced apart from each other. According to various embodiments, the pair of guide members 226 may be oriented to be parallel to the sliding axis 211 and may be positioned so as to be in engagement with the insert portion 216 of the first back panel 210. According to various embodiments, as show, the pair of guide members 226 may be guide rails abutting two lateral sides of the insert portion 216 of the first back panel 210, wherein the two lateral sides are parallel to the sliding axis 211. Accordingly, the pair of guide members 226 may guide the insert portion 216 of the first back panel 210 for the first back panel 210 to slide relative to the second back panel 220 along the sliding axis 211.

According to various embodiments, the extendable cover 200 may, similar to the extendable cover 100 of FIG. 1A, include electrical lines or wiring or cabling. According to various embodiments, the electrical lines or wiring or cabling may be inside or within the extendable cover 100. According to various embodiments, as shown, the extendable cover 200 may, similar to the extendable cover 100 of FIG. 1A to FIG. 1C, include a first electrical cable 230 extending between the first back panel 210 and the second back panel 220. Accordingly, the first electrical cable 230 may run from the first back panel 210 to the second back panel 220. The first electrical cable 230 may be part of the electrical lines or wiring or cabling of the extendable cover 200. According to various embodiments, the first electrical cable 230 may allow or enable electrical communication or signal transmission between the first back panel 210 and the second back panel 220. According to various embodiments, as shown, the first electrical cable 230 may include, but not limited to, flexible flat cable, flexible cable, or ribbon cable.

According to various embodiments, the extendable cover 200 may, similar to the extendable cover 100 of FIG. 1A, include an electrical cable management arrangement 240. According to various embodiments, the electrical cable management arrangement 240 may be configured to manage and prevent the first electrical cable 230 from tangling or kinking or crisscrossing or straining or twisting when the first back panel 210 and the second back panel 220 the extendable cover 200 extend and/or retract with respect to each other. According to various embodiments, the electrical cable management arrangement 240 may be configured to retract or reel in or wind or shorten the first electrical cable 230 when the first back panel 210 and the second back panel 220 are retracted with respect to each other. Further, the electrical cable management arrangement 240 may be configured to extend or reel out or unwind or lengthen or payout the first electrical cable 230 when the first back panel 210 and the second back panel 220 are extended with respect to each other.

According to various embodiments, the electrical cable management arrangement 240 may include a rotatable hub 250 disposed at the second back panel 220. Accordingly, the rotatable hub 250 may be rotatably mounted to the second back panel 220. Hence, the rotatable hub 250 may be rotatable relative to the second back panel 220. According to various embodiments, the rotatable hub 250 may be disposed inside or within the second back panel 220. According to various embodiments, a rotational axis of the rotatable hub 250 may be perpendicular to the second back panel 220. Accordingly, the rotational axis of the rotatable hub 250 may be perpendicular to broad planar surfaces of the second back panel 220.

According to various embodiments, the electrical cable management arrangement 240 may include a flange 252 extending radially from the rotatable hub 250 with respect to the rotational axis. According to various embodiments, the flange 252 may be a plate-like structure protruding from the rotatable hub 250. According to various embodiments, the plate-like structure may be perpendicular to the rotational axis of the rotatable hub 250. According to various embodiments, the plate-like structure may surround the rotatable hub 250. According to various embodiments, the plate-like structure may be of a rectangular shape as shown. According to various embodiments, the plate-like structure may also be of other suitable shapes such as ring-shape, square, triangle, etc.

According to various embodiments, the electrical cable management arrangement 240 may include a hub-biasing mechanism 260. According to various embodiments, the hub-biasing mechanism 260 may be coupled between the rotatable hub 250 and the second back panel 220. Accordingly, the hub-biasing mechanism 260 may interconnect the rotatable hub 250 and the second back panel 220. According to various embodiments, the hub-biasing mechanism 260 may be coupled to the rotatable hub 250 via the flange 252. Accordingly, the hub-biasing mechanism 260 may be directly coupled to the flange 252 which is extending from the rotatable hub 250. Hence, the hub-biasing mechanism 260 may be coupled between the flange 252 and the second back panel 220.

According to various embodiments, the hub-biasing mechanism 260 may bias the rotatable hub 250 in a biased rotational direction relative to the second back panel 220. Accordingly, the hub-biasing mechanism 260 may exert a biasing force against rotating the rotatable hub 250 in a rotational direction that is opposite the biased rotational direction. According to various embodiments, when the rotatable hub 250 is rotated in the rotational direction that is opposite the biased rotational direction, the hub-biasing mechanism 260 may be loaded or imparted with the biasing force to reverse the rotation so as to rotate the rotatable hub 250 in the biased rotational direction to return to a state or disposition before the rotatable hub 250 is rotated and/or the hub-biasing mechanism 260 is loaded.

According to various embodiments, the first electrical cable 230 may be extending between the first back panel 210 and the rotatable hub 250 at the second back panel 220. Accordingly, the first electrical cable 230 may run from the first back panel to the rotatable hub 240. According to various embodiments, a first segment of the first electrical cable 230 may be coupled to the first back panel 210 and a second segment of the first electrical cable 230 may be coupled to the rotatable hub 250. According to various embodiments, the second segment of the first electrical cable 230 may be coupled to the rotatable hub 250 via the flange 252. Accordingly, the second segment of the first electrical cable 230 may be directly coupled to the flange 252 which is extending from the rotatable hub 250. According to various embodiments, the first segment of the first electrical cable 230 may be a first end segment of the first electrical cable 230 and the second segment of the first electrical cable 230 may be a second end segment of the first electrical cable 230.

According to various embodiments, the hub-biasing mechanism 260 may bias the rotatable hub 250 in the biased rotational direction to reel in or retract or wind or shorten the first electrical cable 230, which is extending between the first back panel 210 and the rotatable hub 250 at the second back panel 220, as the first back panel 210 and the second back panel 220 are being slidden relative to each other to move the first edge portion 212 of the first back panel 210 and the second edge portion 222 of the second back panel 220 towards each other. According to various embodiments, the hub-biasing mechanism 260 may be unloaded or may be pre-loaded with slight biasing force when the first back panel 210 and the second back panel 220 of the extendable cover 200 are in the retracted state as shown in FIG. 2C. According to various embodiments, as the first back panel 210 and the second back panel 2120 are being pulled away from each other (or slidden relative to each other) so as to move the first edge portion 212 and the second edge portion 222 further apart or away from each other along the sliding axis 211 to the extended state for fitting the portable electronic device 202 as shown in FIG. 2B, the first electrical cable 230 may extend or reel out or unwind or lengthen or payout from the rotatable hub 250 as a result of the extension between the first back panel 210 and the second back panel 220 along the sliding axis 211. As the first electrical cable 230 is being extended or reeled out or unwound or lengthened or payout from the rotatable hub 250, the rotatable hub 250 may be rotated in the rotational direction that is opposite the biased rotational direction. Accordingly, rotating the rotatable hub 250 in the rotational direction that is opposite the biased rotational direction may load the hub-biasing mechanism 260. The biasing force exerted on the rotatable hub 250 by the hub-biasing mechanism 260 may then rotate the rotatable hub 250 in the biased rotational direction to reel in or retract or wind or shorten the first electrical cable 230 when the first back panel 210 and the second back panel 220 are being slidden relative to each other to move the first edge portion 212 of the first back panel 210 and the second edge portion 222 of the second back panel 220 towards each other.

According to various embodiments, as shown, the hub-biasing mechanism 260 may include a tension spring 262. According to various embodiments, a first end 262a of the tension spring 262 may be coupled to the rotatable hub 250 and a second end 262b of the tension spring 262 may be coupled to the second back panel 120. According to various embodiments, the first end 262a of the tension spring 262 may be coupled to the rotatable hub 250 via the flange 252. Accordingly, the first end 262a of the tension spring 262 may be directly coupled to the flange 252 which is extending from the rotatable hub 250.

According to various embodiments, as shown, the flange 252 extending from the rotatable hub 250 may be of a rectangular shape. Accordingly, the rotatable hub 250 may be located at the center of the rectangular shaped flange 252. Hence, the rectangular shaped flange 252 may resemble a pair of wings extending in opposite radial directions from the rotatable hub 250. According to various embodiments, as shown, the hub-biasing mechanism 260 may include two tension springs 262. According to various embodiments, a first end 262a of each tension spring 262 may be coupled to the rotatable hub 250 via the rectangular shaped flange 252 and a second end 262b of each tension spring 262 may be coupled to the second back panel 220. According to various embodiments, the first end 262a of each tension spring 262 may be directly coupled to a corresponding longitudinal end of the rectangular shaped flange 252.

According to various embodiments, the first back panel 210 may include a first electrical connector 218 for connecting to a first external device, for example the first controller 204. According to various embodiments, the first segment of the first electrical cable 230 may be coupled to the first electrical connector 218 at the first back panel 210. According to various embodiments, the first electrical connector 218 may include a pogo pin connector or a spring-loaded pin connector. According to various embodiments, when the first external device is connected to the first electrical connector 218, electrical signals may be transmitted or received by the first external device through the first electrical connector 218 via the first electrical cable 230.

According to various embodiments, the first electrical connector 218 may be disposed along the first edge portion 212 of the first back panel 210. According to various embodiments, the first external device may be coupled to the first back panel 210 along the first edge portion 212 of the first back panel 210. Accordingly, the first electrical connector 218 may be suitably located so as to contact a corresponding electrical connector from the first external device so as to establish electrical connections between the first external device and the first electrical connector 218. For example, as shown in FIG. 2C, the first electrical connector 218 may be located at an end or extremity of the first edge portion 212 of the first back panel 210 along its length.

According to various embodiments, an outward-facing-narrow-side-surface 219 of the first back panel 210 along the first edge portion 212 of the first back panel 210 may include an interlocking element 219a configured to interlock with a corresponding interlocking element of the first external device for attaching the first external device to the first back panel 210. According to various embodiments, the outward-facing-narrow-side-surface 219 of the first back panel 210 may be a thin face of the first back panel 210 along the first edge portion 212 of the first back panel 210 that is facing outward or away in a direction along the sliding axis 211. According to various embodiments, the interlocking element 219a of the first back panel 210 and the corresponding interlocking element of the first external device may include, but not limited to, a tongue and groove interlocking joint. According to various embodiments, the first external device may be coupled to the first edge portion 212 of the first back panel 210 in a manner such that the corresponding electrical connector of the first external device may be in contact with the first electrical connector 218 of the first back panel 210.

According to various embodiments, as shown, the extendable cover 200 may include a second electrical cable 280 extending between the second back panel 220 and the rotatable hub 250. Accordingly, the second electrical cable 280 may run from the second back panel 220 to the rotatable hub 250. The second electrical cable 280 may be part of the electrical lines or wiring or cabling of the extendable cover 200. According to various embodiments, the second electrical cable 280 may allow or enable electrical communication or signal transmission. According to various embodiments, as shown, the second electrical cable 280 may include, but not limited to, flexible flat cable, flexible cable, or ribbon cable.

According to various embodiments, a first segment of the second electrical cable 280 may be coupled to the second back panel 220 and a second segment of the second electrical cable 280 may be coupled to the rotatable hub 250. According to various embodiments, the second segment of the second electrical cable 280 may be coupled to the rotatable hub 250 via the flange 252. Accordingly, the second segment of the second electrical cable 280 may be directly coupled to the flange 252 which is extending from the rotatable hub 250. According to various embodiments, the first segment of the second electrical cable 280 may be a first end segment of the second electrical cable 280 and the second segment of the second electrical cable 280 may be a second end segment of the second electrical cable 280.

According to various embodiments, the first electrical cable 230 and the second electrical cable 280 may be two different sections of a same continuous single electrical cable. Accordingly, the continuous single electrical cable may go around the rotatable hub 250 with a first section, in the form of the first electrical cable 230, extending between the rotatable hub 250 and the first back panel 210, and with a second section, in the form of the second electrical cable 280, extending between the rotatable hub 250 and the second back panel 220. Accordingly, the continuous single electrical cable may be lined along half a circumference (or a semi-circle) of the rotatable hub 250 such that the first section, i.e. the first electrical cable 230, and the second section, i.e. the second electrical cable 280, may be extending in opposite radial directions from the rotatable hub 250. According to various embodiments, when the flange 252 is of a rectangular shape as shown, the first section and the second section of the continuous single electrical cable extending from the rotatable hub 250 may be lined along a length direction of the rectangular shaped flange 252.

According to various embodiments, the first electrical cable 230 and the second electrical cable 280 may be two separate electrical cables. According to various embodiments, the rotatable hub 250 and/or the flange 252 may be made of or lined with electrical conductive material such that the first electrical cable 230 and the second electrical cable 280 may be in electrical connection with each other when they are coupled to the rotatable hub 250 and/or the flange 252.

According to various embodiments, when the hub-biasing mechanism 260 rotates the rotatable hub 250 in the biased rotational direction to reel in or retract or wind or shorten the first electrical cable 230, the rotatable hub 250 may also reel in or retract or wind or shorten the second electrical cable 280. According to various embodiments, when the first electrical cable 230 is extended or reeled out or unwound or lengthened or payout from the rotatable hub 250 as a result of the extension between the first back panel 210 and the second back panel 220 along the sliding axis 211, the rotatable hub 250 may be rotated in the rotational direction that is opposite the biased rotational direction. Accordingly, rotating the rotatable hub 250 in the rotational direction that is opposite the biased rotational direction may extend or reel out or unwind or lengthen or payout the second electrical cable 280 from the rotatable hub 250.

According to various embodiments, the second back panel 220 may include a second electrical connector 228 for connecting to a second external device, for example the second controller 206. According to various embodiments, the first segment of the second electrical cable 280 may be coupled to the second electrical connector 228 at the second back panel 220. According to various embodiments, the second electrical connector 228 may include a pogo pin connector or a spring-loaded pin connector. According to various embodiments, when the second external device is connected to the second electrical connector 228, electrical signals may be transmitted or received by the second external device through the second electrical connector 228 via the second electrical cable 280.

According to various embodiments, the second electrical connector 228 may be disposed along the second edge portion 222 of the second back panel 220. According to various embodiments, the second external device may be coupled to the second back panel 220 along the second edge portion 222 of the second back panel 220. Accordingly, the second electrical connector 228 may be suitably located so as to contact a corresponding electrical connector from the second external device so as to establish electrical connections between the second external device and the second electrical connector 228. For example, as shown in FIG. 2C, the second electrical connector 228 may be located at an end or extremity of the second edge portion 222 of the second back panel 220 along its length.

According to various embodiments, an outward-facing-narrow-side-surface 229 of the second back panel 220 along the second edge portion 222 of the second back panel 220 may include an interlocking element (not shown, but similar to the interlocking element 219a of the first back panel 210) configured to interlock with a corresponding interlocking element of the second external device for attaching the second external device to the second back panel 220. According to various embodiments, the outward-facing-narrow-side-surface 229 of the second back panel 220 may be a thin face of the second back panel 220 along the second edge portion 222 of the second back panel 220 that is facing outward or away in a direction along the sliding axis 211. According to various embodiments, the interlocking element of the second back panel 220 and the corresponding interlocking element of the second external device may include, but not limited to, a tongue and groove interlocking joint. According to various embodiments, the second external device may be coupled to the first edge portion 212 of the first back panel 210 in a manner such that the corresponding electrical connector of the second external device may be in contact with the first electrical connector 218 of the first back panel 210.

According to various embodiments, the first edge portion 212 of the first back panel 210 may include a first raised edge formation 214. According to various embodiments, the first raised edge formation 214 may include, but not limited to, a lip or a ledge or a long narrow elevation or a ridge along the first edge portion 212. Accordingly, the first raised edge formation 214 may be a narrow protruding edge along the first edge portion 212. According to various embodiments, the second edge portion 222 of the second back panel 220 may include a second raised edge formation 224. According to various embodiments, the second raised edge formation 224 may include, but not limited to, a lip or a ledge or a long narrow elevation or a ridge along the second edge portion 222. Accordingly, the second raised edge formation 224 may be a narrow protruding edge along the second edge portion 222. According to various embodiments, the first electrical connector 218 may be disposed at a longitudinal end of the first raised edge formation 214 of the first back panel 210. According to various embodiments, the second electrical connector 228 may be disposed at a longitudinal end of the second raised edge formation 224 of the second back panel 220.

According to various embodiments, the first back panel 210 and the second back panel 220 may be linearly slidable relative to each other to move the first raised edge formation 214 of the first back panel 210 and the second raised edge formation 224 of the second back panel 220 towards each other or away from each other along the sliding axis 211 for fitting the portable electronic device between the first raised edge formation 214 of the first back panel 210 and the second raised edge formation 224 of the second back panel 220. Accordingly, when the portable electronic device is fitted between the first raised edge formation 214 of the first back panel 210 and the second raised edge formation 224 of the second back panel 220, the first raised edge formation 214 and the second raised edge formation 224 may be moved towards each other to hold or retain or grip or clamp or sandwich the portable electronic device 202 therebetween. According to various embodiments, the first raised edge formation 214 and the second raised edge formation 224 may be opposing each other across the extendable cover 200 along the sliding axis 211. According to various embodiments, the first raised edge formation 214 and the second raised edge formation 224 may be protruding from the first back panel 210 and the second back panel 220 respectively on a same side of the extendable cover 200. According to various embodiments, the first raised edge formation 214 and the second raised edge formation 224 may be a pair of parallel opposing narrow protruding edges along two opposite edge portions 212, 222 of the extendable cover 200.

According to various embodiments, the extendable cover 200 may, similar to the extendable cover 100 of FIG. 1A, include a panel-biasing mechanism 270. According to various embodiments, the panel-biasing mechanism 270 may be coupled between the first back panel 210 and the second back panel 220. Accordingly, the panel-biasing mechanism 270 may interconnect the first back panel 210 and the second back panel 220. According to various embodiments, the panel-biasing mechanism 270 may exert a biasing force against moving the first edge portion 212 of the first back panel 210 and the second edge portion 222 of the second back panel 220 away from each other along the sliding axis 211. Accordingly, the panel-biasing mechanism 270 may bias against moving the first raised edge formation 214 of the first back panel 210 and the second raised edge formation 224 of the second back panel 220 away from each other along the sliding axis 211. According to various embodiments, the panel-biasing mechanism 270 may be preloaded so as to hold or retain or maintain the first back panel 210 and the second back panel 220 of the extendable cover 200 in the retracted state as shown in FIG. 2C.

According to various embodiments, as the first back panel 210 and the second back panel 220 are being pulled away from each other (or slidden relative to each other) so as to move the first edge portion 212 and the second edge portion 222 (as well as the first raised edge formation 214 and the second raised edge formation 224) further apart or away from each other along the sliding axis 211 to the extended state for fitting the portable electronic device 202 as shown in FIG. 2B, extension between the first back panel 210 and the second back panel 220 may further load the panel-biasing mechanism 270. Accordingly, when the portable electronic device 202 is fitted to the extendable cover 200 in the extended state, the biasing force exerted by the panel-biasing mechanism 270 may cause the first raised edge formation 214 and the second raised edge formation 224 to urge or move towards each other to hold or retain or grip or clamp or sandwich the portable electronic device 202 therebetween. Hence, the panel-biasing mechanism 270 coupled between the first back panel 210 and the second back panel 220 may exert the biasing force to hold or retain or grip or clamp or sandwich the portable electronic device 202 between the first raised edge formation 214 of the first back panel 210 and the second raised edge formation 224 of the second back panel 220. Further, when the portable electronic device 202 is removed from the extendable cover 200, the biasing force exerted by the panel-biasing mechanism 270 may move the first back panel 210 and the second back panel 220 towards each other to return to the retracted state. Accordingly, the panel-biasing mechanism 270 may automatically return the extendable cover 200 to the retracted state without requiring external assistance or application of an external force.

According to various embodiments, as shown, the panel-biasing mechanism 270 may include, but not limited to, a tension spring 272. According to various embodiments, when the panel-biasing mechanism 270 is the tension spring 272, a first end 272a of the tension spring 272 may be coupled to the first back panel 210 and a second end 272b of the tension spring 272 may be coupled to the second back panel 220. According to various embodiments, the first end 272a of the tension spring 272 may be coupled to the insert portion 216 of the first back panel 210. According to various embodiments, the tension spring 272 may be oriented to be parallel to the sliding axis 211. According to various embodiments, the panel-biasing mechanism 270 may include two tension springs 272. According to various embodiments, the two tension springs 272 may be laterally spaced apart so as to be coupled to two different regions of the insert portion 216 of the first back panel 210. According to various embodiments, the tension spring 272 may be pre-tension so as to hold or retain or maintain the first back panel 210 and the second back panel 220 of the extendable cover 200 in the retracted state.

Figure 3A:
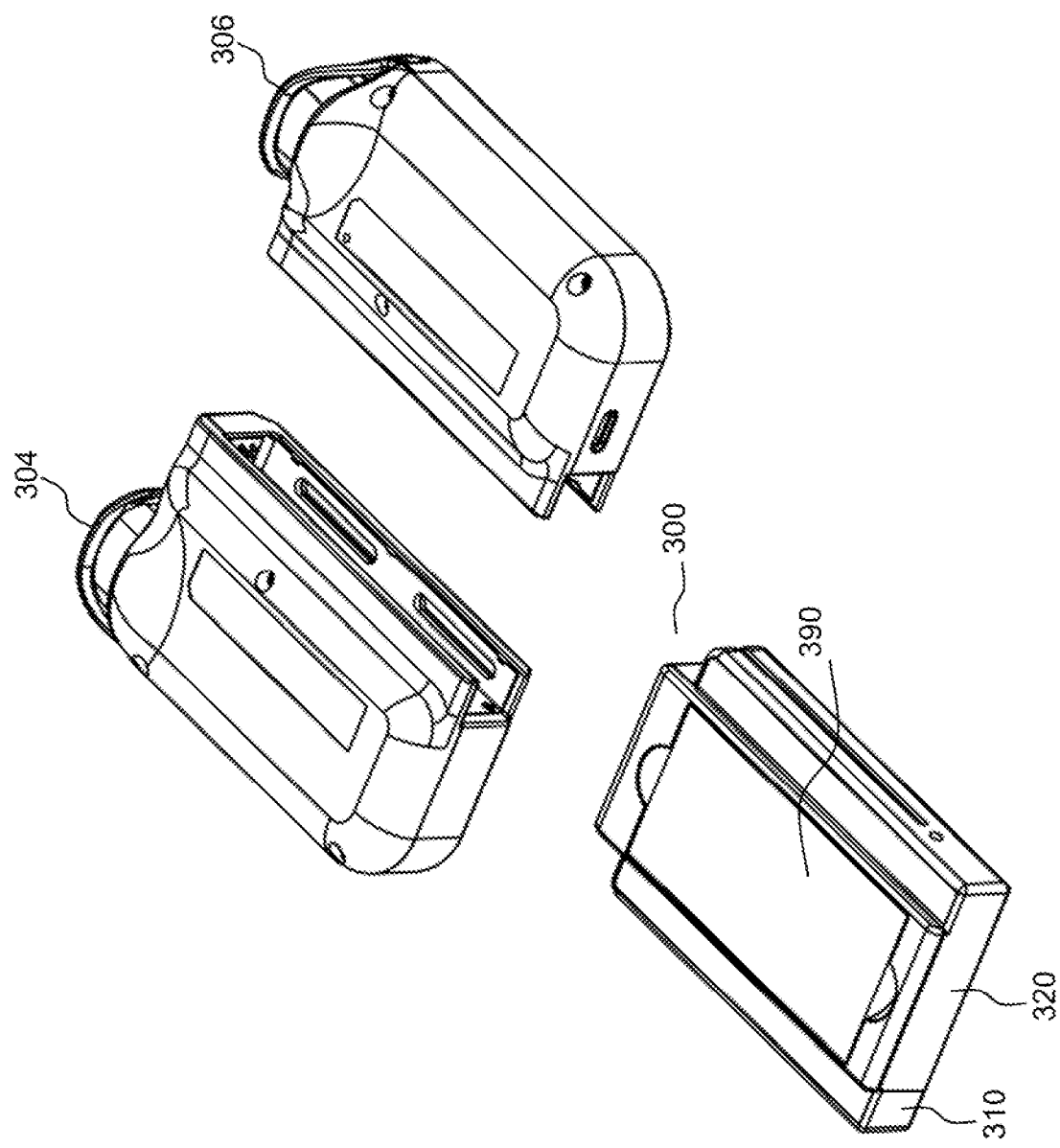
FIG. 3A shows a back view of an extendable cover and a pair of controllers according to various embodiments.
Figure 3B:
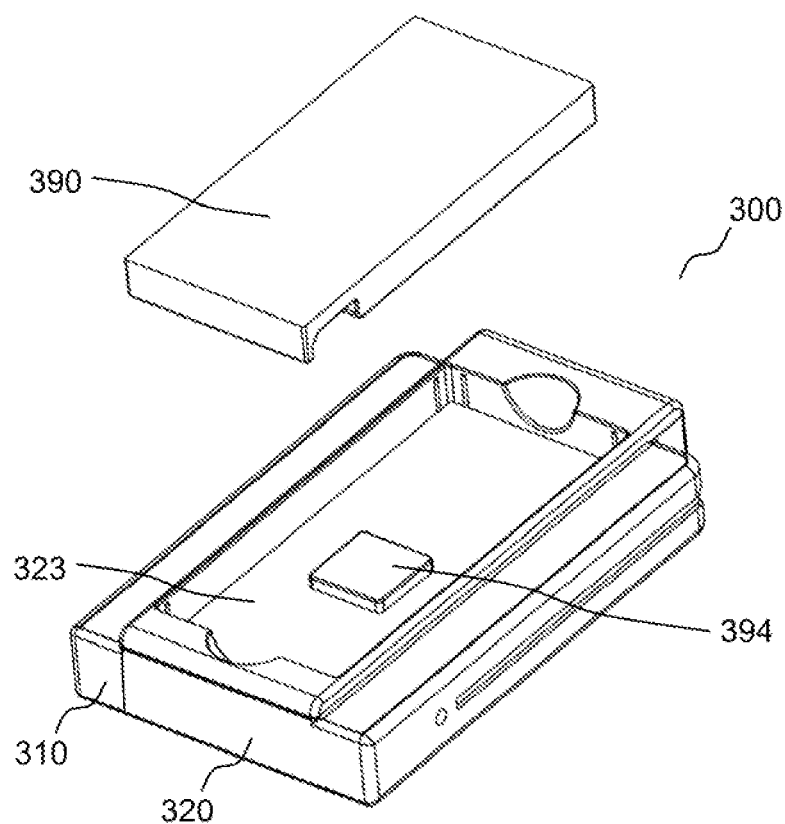
FIG. 3B shows a back view of the extendable cover of FIG. 3A with a stand in a folded state detached from the extendable cover according to various embodiments.
Figure 3C:
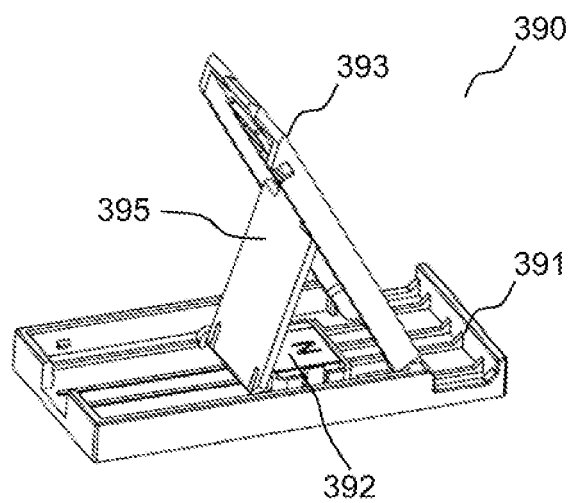
FIG. 3C shows the stand of FIG. 3B in a deployed state according to various embodiments.

FIG. 3A shows a back view of an extendable cover 300 and a pair of controllers 304, 306 according to various embodiments. FIG. 3B shows a back view of the extendable cover 300 with a stand 390 in a folded state detached from the extendable cover 300 according to various embodiments. FIG. 3C shows the stand of FIG. 3B in a deployed state according to various embodiments.

According to various embodiments, the extendable cover 300 of FIG. 3A and FIG. 3B may contain all the features of the extendable cover 100 of FIG. 1A to FIG. 1C and the extendable cover 200 of FIG. 2A to FIG. 2D. Accordingly, all features, changes, modifications, and variations that are applicable to the extendable cover 100 of FIG. 1A to FIG. 1C and the extendable cover 200 of FIG. 2A to FIG. 2D may also be applicable to the extendable cover 300 of FIG. 3A and FIG. 3B. According to various embodiments, the extendable cover 300 may, similar to the extendable cover 100 of FIG. 1A and the extendable cover 200 of FIG. 2A to FIG. 3D, include a first back panel 310, a second back panel 320, a cable management arrangement (not shown), and a panel-biasing mechanism (not shown). According to various embodiments, the extendable cover 300 of FIG. 3A and FIG. 3B may further include the following limitations and/or features.

According to various embodiments, the extendable cover 300 may include the stand 390 for the portable electronic device removably attached to the second back panel 320. According to various embodiments, the stand 390 may be removably attached to a rear or a back of the second back panel 320. Accordingly, the stand 390 may be at the side of the second back panel 320 opposite the side of the second back panel 320 which the portable electronic device is abutting. Hence, the stand 390 may be behind the second back panel 320.

According to various embodiments, the stand 390 may include a first engagement element 392 and the second back panel 320 may include a second engagement element 394. According to various embodiments, the first engagement element 392 and the second engagement element 394 may be configured to removably attach the stand 390 to the second back panel 320. According to various embodiments, the first engagement element 392 and the second engagement element 394 may include, but not limited to, a magnetic engagement arrangement, a removable snap-fit arrangement, or a Velcro arrangement.

According to various embodiments, when the first engagement element 392 and the second engagement element 394 is the magnetic engagement arrangement, the first engagement element 392 and the second engagement element 394 may be a pair of magnets.

According to various embodiments, the second back panel 320 may include a recessed portion 323. According to various embodiments, the stand 390 may be attached to the second back panel 320 with the stand 390 inserted into the recessed portion 323. Accordingly, the recessed portion 323 of the second back panel 320 may receive the stand 390. According to various embodiments, the recessed portion 323 of the second back panel 320 may be a receding part or space in a rear surface or back surface of the second back panel 320.

According to various embodiments, the stand 390 may include a base part 391, a rest part 393 pivotably coupled to the base part 391, and a support part 395 pivotably coupled to the rest part 393. According to various embodiments, each of the base part 391, the rest part 393 and the support part 395 may be a plate-like or a panel-like structure. Accordingly, the base part 391 may be pivotably coupled to a first portion of the rest part 393 and the support part 395 may be pivotably coupled to a second portion of the rest part 393. The first portion of the rest part 393 and the second portion of the rest part 393 may be laterally spaced apart from each other along the rest plate 393. According to various embodiments, a pivot axis between the base part 391 and the rest part 393 may be parallel to a pivot axis between the rest part 393 and the support part 395. According to various embodiments, in the folded state, the support part 395 may be pivoted flat onto the rest part 393, and the rest part 393 may be pivoted together with the support part 395 onto the base part 391. Accordingly, in the folded state, the support part 395 may be between the rest part 393 and the base part 391. Hence, in the folded state, the rest part 393 and the base part 391 may sandwich the support part 395. According to various embodiments, in the deployed state, the rest part 393 may be pivoted away from the base part 391 to incline from the base part 391, and the support part 395 may be pivoted away from the rest part 393 to engage a free end of the support part 395 to the base part 391 at an angle in a manner so as to support the rest part 393 at the inclined position with respect to the base part 391. Accordingly, the base part 391, the rest part 393 and the support part 395 may form a triangle configuration in the deployed state. According to various embodiments, the base part 391 may include a slot or a groove for receiving the free end of the support part 395 such that the support part 395 may be secured and locked in position to maintain the rest part 393 at the inclined position.

The following examples pertain to various embodiments.

Example 1 is an extendable cover for a portable electronic device, the cover including:
a first back panel having a first edge portion;
a second back panel having a second edge portion, wherein the first back panel and the second back panel are in sliding engagement with each other so as to be linearly slidable relative to each other to move the first edge portion and the second edge portion towards each other or away from each other along a sliding axis, wherein the first edge portion of the first back panel and the second edge portion of the second back panel are opposite ends of the extendable cover along the sliding axis; and
an electrical cable management arrangement including
a rotatable hub disposed at the second back panel, and
a hub-biasing mechanism coupled between the rotatable hub and the second back panel to bias the rotatable hub in a biased rotational direction to reel in a first electrical cable extending between the first back panel and the rotatable hub as the first back panel and the second back panel are being slidden relative to each other to move the first edge portion of the first back panel and the second edge portion of the second back panel towards each other, wherein a first segment of the first electrical cable is coupled to the first back panel and a second segment of the first electrical cable is coupled to the rotatable hub.

In Example 2, the subject matter of Example 1 may optionally include that the first edge portion of the first back panel may include a first raised edge formation and the second edge portion of the second back panel may include a second raised edge formation,
wherein the first back panel and the second back panel may be linearly slidable relative to each other to move the first raised edge formation of the first back panel and the second raised edge formation of the second back panel towards each other or away from each other along the sliding axis for fitting the portable electronic device between the first raised edge formation of the first back panel and the second raised edge formation of the second back panel, wherein the first raised edge formation and the second raised edge formation may be opposing each other and may be protruding from the first back panel and the second back panel respectively on a same side of the extendable cover.

In Example 3, the subject matter of Examiner 1 or 2 may optionally include that the second back panel may be a hollow panel, wherein the rotatable hub of the electrical cable management and the hub-biasing mechanism of the electrical cable management arrangement may be disposed inside the hollow panel.

In Example 4, the subject matter of Example 3 may optionally include that a portion of the first back panel may be inserted into the second back panel so as to be in sliding engagement with the second back panel.

In Example 5, the subject matter of any one of Examples 1 to 4 may optionally include a panel-biasing mechanism coupled between the first back panel and the second back panel to exert a biasing force against moving the first edge portion of the first back panel and the second edge portion of the second back panel away from each other along the sliding axis.

In Example 6, the subject matter of Example 5 may optionally include that the panel-biasing mechanism may include a tension spring with a first end coupled to the first back panel and a second end coupled to the second back panel.

In Example 7, the subject matter of Example 5 or 6 in combination with Example 2 may optionally include that the panel-biasing mechanism coupled between the first back panel and the second back panel may be configured to exert the biasing force to clamp the portable electronic device between the first raised edge formation of the first back panel and the second raised edge formation of the second back panel.

In Example 8, the subject matter of any one of Examples 1 to 7 may optionally include that the first back panel may include a first electrical connector for connecting to a first external device, wherein the first segment of the first electrical cable may be coupled to the first electrical connector at the first back panel.

In Example 9, the subject matter of Example 8 may optionally include that the first electrical connector may be disposed along the first edge portion of the first back panel.

In Example 10, the subject matter of Example 8 or 9 may optionally include that an outward-facing-narrow-side-surface along the first edge portion of the first back panel may include an interlocking element configured to interlock with a corresponding interlocking element at the first external device for attaching the first external device to the first back panel in a manner such that a corresponding electrical connector of the first external device may be in contact with the first electrical connector of the first back panel.

In Example 11, the subject matter of any one of Examples 1 to 10 may optionally include that the electrical cable management arrangement may include a flange extending radially from the rotatable hub with respect to a rotational axis, wherein the hub-biasing mechanism may be coupled between the flange and second back panel.

In Example 12, the subject matter of Example 11 may optionally include that the hub-biasing mechanism may include a tension spring with a first end coupled to the flange and a second end coupled to the second back panel.

In Example 13, the subject matter of any one of Examples 1 to 12 may optionally include that a second electrical cable may extend between the second back panel and the rotatable hub, wherein a first segment of the second electrical cable may be coupled to the second back panel and a second segment of the second electrical cable may be coupled to the rotatable hub.

In Example 14, the subject matter of Example 13 may optionally include that the second back panel may include a second electrical connector for connecting to a second external device, wherein the first segment of the second electrical cable may be coupled to the second electrical connector at the second back panel.

In Example 15, the subject matter of Example 14 may optionally include that the second electrical connector may be disposed along the second edge portion of the second back panel.

In Example 16, the subject matter of Example 14 or 15 may optionally include that an outward-facing-narrow-side along the second portion of the second back panel may include an interlocking element configured to interlock with a corresponding interlocking element at the second external device for attaching the second external device to the second back panel in a manner such that a corresponding electrical connector of the second external device may be in contact with the second electrical connector of the second back panel.

In Example 17, the subject matter of any one of Examples 1 to 16 may optionally include a stand for the portable electronic device removably attached to the second back panel.

In Example 18, the subject matter of Example 17 may optionally include that the stand may include a first engagement element and the second back panel may include a second engagement element, wherein the first engagement element and the second engagement element may be configured to removably attach the stand to the second back panel.

In Example 19, the subject matter of Example 17 or 18 may optionally include that the first engagement element and the second engagement element may include a pair of magnets.

In Example 20, the subject matter of any one of Examples 17 to 19 may optionally include that the second back panel may include a recessed portion to receive the stand.

In Example 21, the subject matter of any one of Examples 17 to 19 may optionally include that the stand may include
  a base part,
  a rest part pivotably coupled to the base piece, and
  a support part pivotably coupled to the rest part.
  wherein, in a folded state, the support part may be pivoted flat onto the rest part, and the rest part may be pivoted together with the support part onto the base part in a manner such that the support part may be between the rest part and the base part,
  wherein, in a deployed state, the rest part may be pivoted away from the base part to incline from the base part, and the support part may be pivoted away from the rest part to engage a free end of the support part to the base part at an angle in a manner so as to support the rest part at the inclined position with respect to the base part, whereby the base part, the rest part and the support part may form a triangle configuration.

In Example 22, the subject matter of Example 21 in combination with Example 20 may optionally include that the stand is in the folded state when fitted into the recessed portion of the second back panel.

Various embodiments, have provided an extendable cover which can be fitted over a back of a portable electronic device for providing protection to the portable electronic device. The extendable cover of the various embodiments is also configured in a manner such that mobile controllers may be attached to the extendable cover without removing the extendable cover from the portable electronic device when using the portable electronic device for gaming. Accordingly, various embodiments have provided a versatile and elegant solution to protect the portable electronic device while also capable of facilitating gaming when required.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. An extendable cover for a portable electronic device, the cover comprising:
   a first back panel having a first edge portion;
   a second back panel having a second edge portion, wherein the first back panel and the second back panel are in sliding engagement with each other so as to be linearly slidable relative to each other to move the first edge portion and the second edge portion towards each other or away from each other along a sliding axis, wherein the first edge portion of the first back panel and the second edge portion of the second back panel are opposite ends of the extendable cover along the sliding axis; and
   an electrical cable management arrangement comprising
      a rotatable hub disposed at the second back panel, and
      a hub-biasing mechanism coupled between the rotatable hub and the second back panel to bias the rotatable hub in a biased rotational direction to reel in a first electrical cable extending between the first back panel and the rotatable hub as the first back panel and the second back panel are being slidden relative to each other to move the first edge portion of the first back panel and the second edge portion of the second back panel towards each other, wherein a first segment of the first electrical cable is coupled to the first back panel and a second segment of the first electrical cable is coupled to the rotatable hub.

2. The cover as claimed in claim 1,
   wherein the first edge portion of the first back panel comprises a first raised edge formation and the second edge portion of the second back panel comprises a second raised edge formation,
   wherein the first back panel and the second back panel are linearly slidable relative to each other to move the first raised edge formation of the first back panel and the second raised edge formation of the second back panel towards each other or away from each other along the sliding axis for fitting the portable electronic device between the first raised edge formation of the first back panel and the second raised edge formation of the second back panel, wherein the first raised edge formation and the second raised edge formation are opposing each other and are protruding from the first back panel and the second back panel respectively on a same side of the extendable cover.

3. The cover as claimed in claim 1, wherein the second back panel is a hollow panel, wherein the rotatable hub of the electrical cable management and the hub-biasing mechanism of the electrical cable management arrangement are disposed inside the hollow panel.

4. The cover as claimed in claim 3, wherein a portion of the first back panel is inserted into the second back panel so as to be in sliding engagement with the second back panel.

5. The cover as claimed in claim 2, further comprising a panel-biasing mechanism coupled between the first back panel and the second back panel to exert a biasing force against moving the first edge portion of the first back panel and the second edge portion of the second back panel away from each other along the sliding axis.

6. The cover as claimed in claim 5, wherein the panel-biasing mechanism comprises a tension spring with a first end coupled to the first back panel and a second end coupled to the second back panel.

7. The cover as claimed in claim 5, wherein the panel-biasing mechanism coupled between the first back panel and the second back panel is configured to exert the biasing force to clamp the portable electronic device between the first raised edge formation of the first back panel and the second raised edge formation of the second back panel.

8. The cover as claimed in claim 1, wherein the first back panel comprises a first electrical connector for connecting to a first external device, wherein the first segment of the first electrical cable is coupled to the first electrical connector at the first back panel.

9. The cover as claimed in claim 8, wherein the first electrical connector is disposed along the first edge portion of the first back panel.

10. The cover as claimed in claim 9, wherein an outward-facing-narrow-side-surface along the first edge portion of the first back panel comprises an interlocking element configured to interlock with a corresponding interlocking element at the first external device for attaching the first external device to the first back panel in a manner such that a corresponding electrical connector of the first external device is in contact with the first electrical connector of the first back panel.

11. The cover as claimed in claim 10, wherein a second electrical cable extends between the second back panel and the rotatable hub, wherein a first segment of the second electrical cable is coupled to the second back panel and a second segment of the second electrical cable is coupled to the rotatable hub.

12. The cover as claimed in claim 11, wherein the second back panel comprises a second electrical connector for connecting to a second external device, wherein the first segment of the second electrical cable is coupled to the second electrical connector at the second back panel.

13. The cover as claimed in claim 12, wherein the second electrical connector is disposed along the second edge portion of the second back panel.

14. The cover as claimed in claim 13, wherein an outward-facing-narrow-side along the second portion of the second back panel comprises an interlocking element configured to interlock with a corresponding interlocking element at the second external device for attaching the second external device to the second back panel in a manner such that a corresponding electrical connector of the second external device is in contact with the second electrical connector of the second back panel.

15. The cover as claimed in claim 1, wherein the electrical cable management arrangement comprises a flange extending radially from the rotatable hub with respect to a rotational axis, wherein the hub-biasing mechanism is coupled between the flange and second back panel.

16. The cover as claimed in claim 15, wherein the hub-biasing mechanism comprises a tension spring with a first end coupled to the flange and a second end coupled to the second back panel.

17. The cover as claimed in claim 1, further comprising a stand for the portable electronic device, the stand being removably attached to the second back panel,
   wherein the stand comprise a first engagement element and the second back panel comprises a second engagement element, wherein the first engagement element and the second engagement element are configured to removably attach the stand to the second back panel.

18. The cover as claimed in claim 17, wherein the first engagement element and the second engagement element comprises a pair of magnets.

19. The cover as claimed in claim 17, wherein the second back panel comprises a recessed portion to receive the stand.

20. The cover as claimed in claim 19, wherein the stand comprises
- a base part,
- a rest part pivotably coupled to the base piece, and
- a support part pivotably coupled to the rest part,
- wherein, in a folded state, the support part is pivoted flat onto the rest part, and the rest part is pivoted together with the support part onto the base part in a manner such that the support part is between the rest part and the base part,
- wherein, in a deployed state, the rest part is pivoted away from the base part to incline from the base part, and the support part is pivoted away from the rest part to engage a free end of the support part to the base part at an angle in a manner so as to support the rest part at the inclined position with respect to the base part, whereby the base part, the rest part and the support part forms a triangle configuration,
- wherein the stand is in the folded state when fitted into the recessed portion of the second back panel.

\* \* \* \* \*